United States Patent [19]
Nakazawa

[11] Patent Number: 5,807,448
[45] Date of Patent: Sep. 15, 1998

[54] SOLID OBJECT GENERATION

[75] Inventor: Hideki Nakazawa, Tokyo, Japan

[73] Assignee: Yugen Kaisha Aloalo International, Tokyo, Japan

[21] Appl. No.: 799,477

[22] Filed: Feb. 12, 1997

[30] Foreign Application Priority Data

Jul. 16, 1996 [JP] Japan .................................. 8-186369

[51] Int. Cl.⁶ .................................................. B32B 31/00
[52] U.S. Cl. ............................. 156/58; 156/64; 156/350; 156/362; 345/420; 345/424; 364/468.26
[58] Field of Search .............................. 156/58, 64, 350, 156/360, 362; 345/419, 420, 424; 364/468.26, 468.27

[56] References Cited

U.S. PATENT DOCUMENTS 5,014,207  5/1991  Lawton .............................. 364/468.26
5,263,130  11/1993 Pomerantz et al. ..................... 345/418
5,534,104  7/1996  Langer et al. ........................ 156/275.5
5,594,652  1/1997  Penn et al. .......................... 364/468.26
5,642,293  6/1997  Manthey et al. ........................ 364/508

FOREIGN PATENT DOCUMENTS

S63-251227  10/1988  Japan .

Primary Examiner—David A. Simmons
Assistant Examiner—Paul M. Rivard
Attorney, Agent, or Firm—Notaro & Michalos P.C.

[57] ABSTRACT

Shaping elements are arranged and fixed according to an attribute data of voxels to produce a shaped article corresponding to the attribute data. A conversion unit 52 produces a shaping element information based on the attribute data from a three-dimensional cell attribute information memorizing unit 23 and stores it in a shaping element information memorizing unit 53. A solid object generator 51 controls a stacker 56, a transportation unit 57, and a picker 58 depending on the shaping element information to align the shaping elements in a shaping area. It also controls a coating unit 59 to apply an adhesive to the shaping elements to bond them to each other.

11 Claims, 12 Drawing Sheets

SOLID OBJECT GENERATION

BACKGROUND OF THE INVENTION

The present invention relates to an apparatus and a method for generating a solid object or producing a shaped article and, more particularly, to an apparatus and a method for arranging and fixing shaping or solid elements in accordance with an attribute data of a voxel to produce a solid object corresponding to the attribute data. The present invention also relates to blending apparatus and method for use in blending a material of medical and pharmaceutical products, foods, and electrical parts to produce an end product or an intermediate product.

Computers have widely been used to design, display, and produce three-dimensional articles. Numerically controlled machines as well as computers have also widely been used to shape, mill, groove, cut, and assemble articles and/or parts thereof. Japanese Patent Laid-open No. 63-251227 discloses a technique to produce a target shaped article by means of a repeated process of scanning over a layer of a liquid photo-curing resin in accordance with a data generated by the computer indicative of a contour of the target shaped article to cure the layer of the resin. There has been, however, no apparatus nor method of producing a three-dimensional shaped article or a prototype thereof by using a voxel data defining the three-dimensional shaped article.

It must be very useful if there were a device, i.e., a solid object generator that receives a data associated with a three-dimensional shaped article and produces the three-dimensional shaped article itself just as a user who processed an image of the three-dimensional shaped article by using a three-dimensional graphics system produces a two-dimensional image through a common printer. The present inventor had made tremendous studies to realize such a solid object generator, and the present invention was thus completed.

The present invention was made with respect to the above mentioned problems, and an object thereof is to provide an apparatus and a method capable of producing a three-dimensional shaped article or a prototype thereof by using a data indicative of an attribute of a voxel defining the three-dimensional shaped article. Another object of the present invention is to provide blending apparatus and method for use in blending a material of medical and pharmaceutical products, foods, and electrical parts to produce an end product or an intermediate product of the medical and pharmaceutical products, the foods, and the electrical parts.

SUMMARY OF THE INVENTION

In order to achieve the above mentioned objects, according to an aspect of the present invention, a solid object generation apparatus is provided with means for memorizing one or more attributes for each of a plurality of voxels filling a predetermined three-dimensional space; means for arranging shaping elements in a predetermined shaping space in accordance with locations and attributes of the voxels, each of the shaping elements corresponding to one voxel or a group of voxels; and means for fixing at least a part of the shaping elements after being arranged.

With this structure, it is possible to produce a shaped article in accordance with the attributes of the voxels.

According to another aspect of the present invention, there is provided a solid object generation method comprising the steps of memorizing one or more attributes for each of a plurality of voxels filling a predetermined three-dimensional space; arranging shaping elements in a predetermined shaping space in accordance with locations and attributes of the voxels, each of the shaping elements corresponding to one voxel or a group of voxels; and fixing at least a part of the shaping element after being arranged.

According to still another aspect of the present invention, an arranging apparatus is provided with means for memorizing one or more attributes for a plurality voxels filling a predetermined three-dimensional space; means for arranging elements in a predetermined real space in accordance with locations and attributes of the voxels, each of the arranging elements corresponding to one voxel or a group of voxels; and means for fixing at least a part of the arranging elements after being arranged.

With this structure, the arranging element may be materials for medical and pharmaceutical products, foods, and electrical parts.

The foregoing and other objects, features, aspects and advantages of the present invention will become apparent from the following detailed description of the preferred embodiment, given by way of illustration and not of limitation with reference to the accompanying drawings, in which:

DETAILED DESCRIPTION OF THE PREFERRED EMBODIMENTS

Embodiments of the present invention are described below. In the first embodiment, a three-dimensional shaped article is produced in accordance with a three-dimensional image generated by using a three-dimensional graphics system. This system can be applied for the production of, for example, medical and pharmaceutical products, foods, and electrical parts with different materials.

Figure 1:
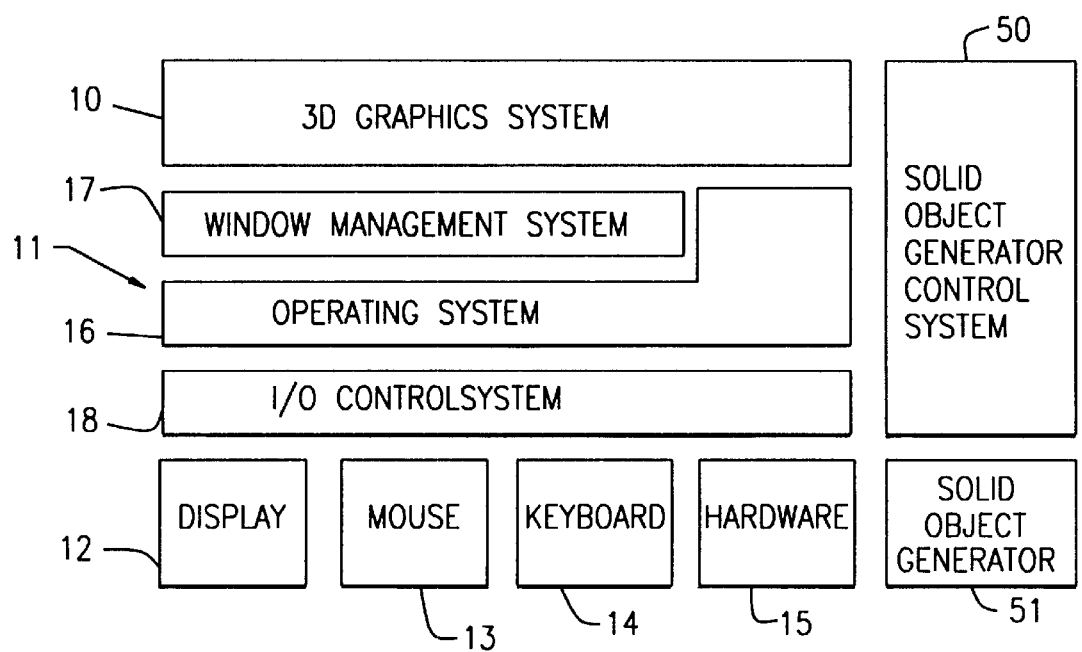
FIG. 1 is a block diagram generally showing an apparatus according to an embodiment of the present invention.

FIG. 1 shows a configuration of information processing systems in which the present invention is implemented. In this configuration, a three-dimensional shaped article is produced by means of a solid object generator control system 50 and a solid object generator 51 in accordance with a three-dimensional image generated by a three-dimensional graphics system 10. In FIG. 1, the three-dimensional graphics system 10 according to an embodiment of the present invention is realized as a program carried out by a central processing unit (not shown) in a computer assembly 11. The computer assembly 11 may be a set of common personal computer. The computer assembly 11 comprises a monitor 12, a mouse device 13, a keyboard 14, miscellaneous hardware 15, an operating system (OS) 16, a window management system 17, and an input/output (I/O) control system 18. The configuration of the computer assembly 11 may be changed as desired.

Figure 2:
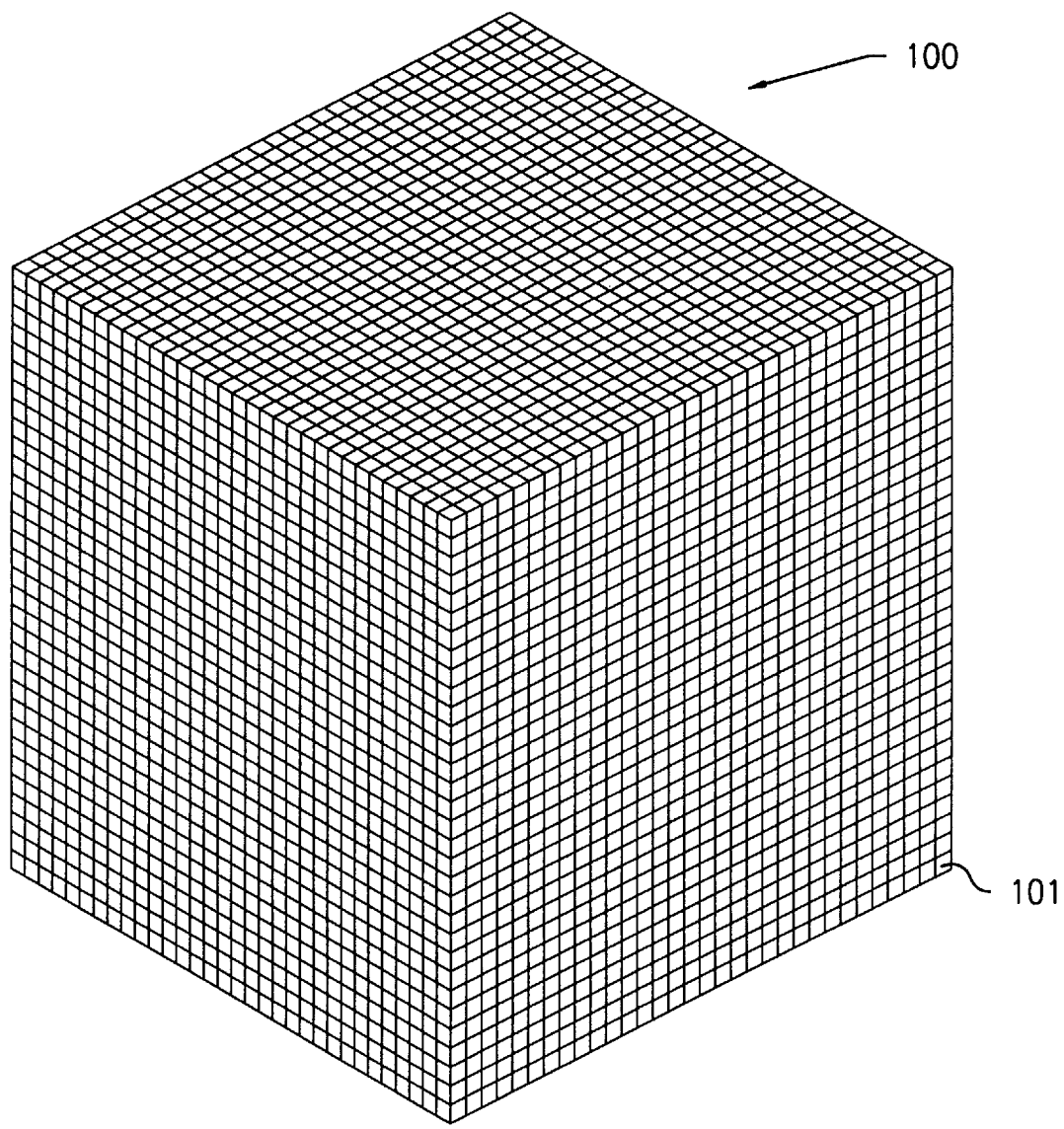
FIG. 2 is a view showing a three-dimensional space used in the embodiment.

FIG. 2 shows a three-dimensional space 100 controlled by the three-dimensional graphics system 10. The three-dimensional space 100 is filled with a number of three-dimensional cells 101. Each cell has a regular hexahedral shape. In FIG. 2, the three-dimensional space 100 is formed of 32,768 (i.e., 32 by 32 by 32) cells for the purpose of description. The number of the cells 101 is, however, not limited thereto. It is preferable for a practical use to determine the number of the cells 101 depending on the resolution of a screen used. This embodiment is for a case to determine optical attributes of the three-dimensional cells 101 such as lightness, chromaticness, hue (or corresponding RGB signals). Initial attributes are blank or transparent.

Figure 3:
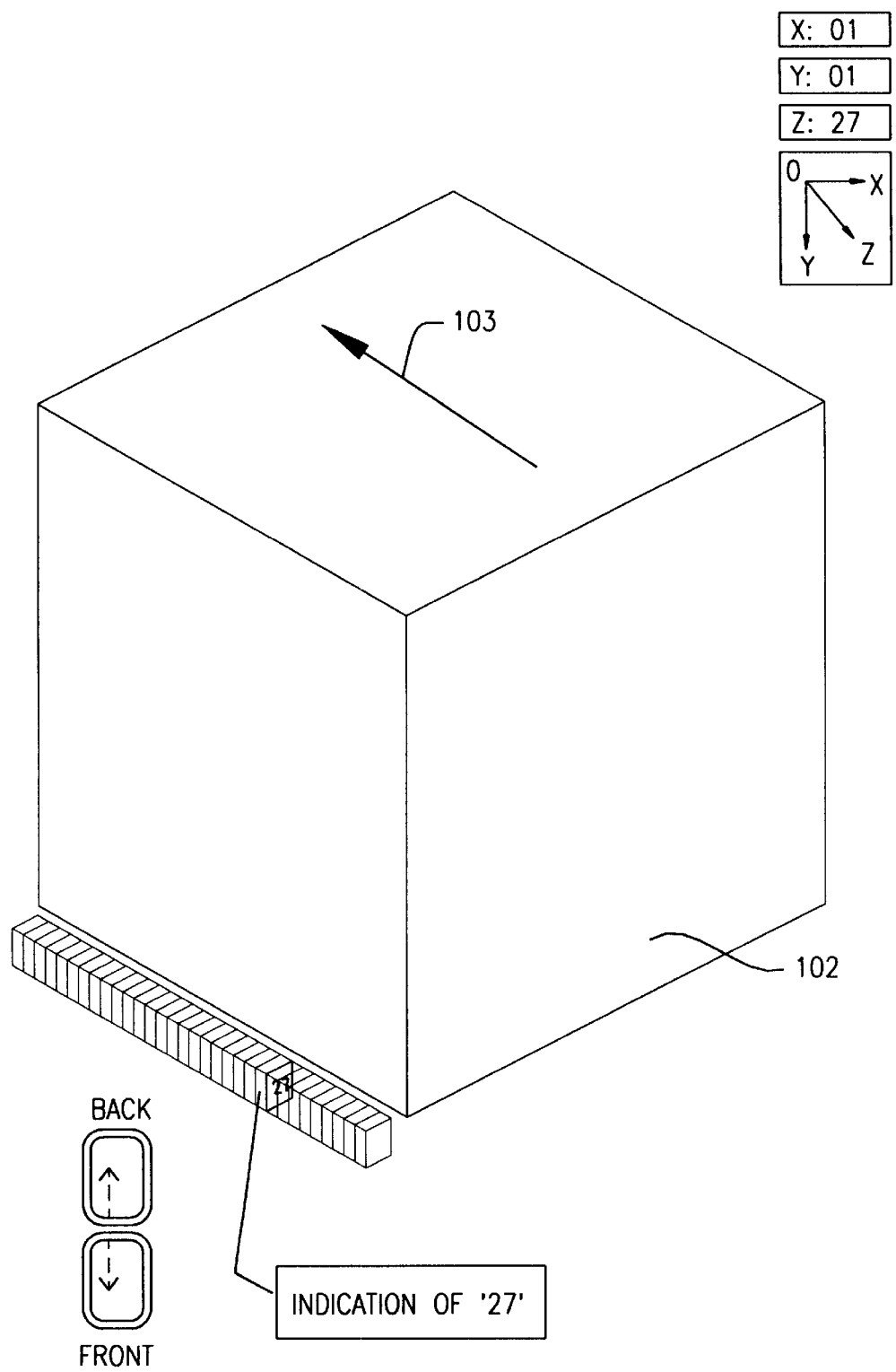
FIG. 3 is a view for use in describing an operation of processing an image in a three-dimensional graphics system used in the embodiment.

In this embodiment, a two-dimensional plane 102 and an overall depth 103 are used to specify the three-dimensional cell 101, as shown in FIG. 3. The two-dimensional plane 102 is displayed for a user such that the plane 102 coincides with or is in parallel to a display screen on the monitor 12 where the graphical images are displayed. The user can designate any point on the two-dimensional plane 102 without feeling something wrong, by using a screen pointing device such as the mouse device 13 and the keyboard 14. A location in the direction of the overall depth 103 can be designated by using, for example, vertical arrow keys on the keyboard 14.

Figure 4:
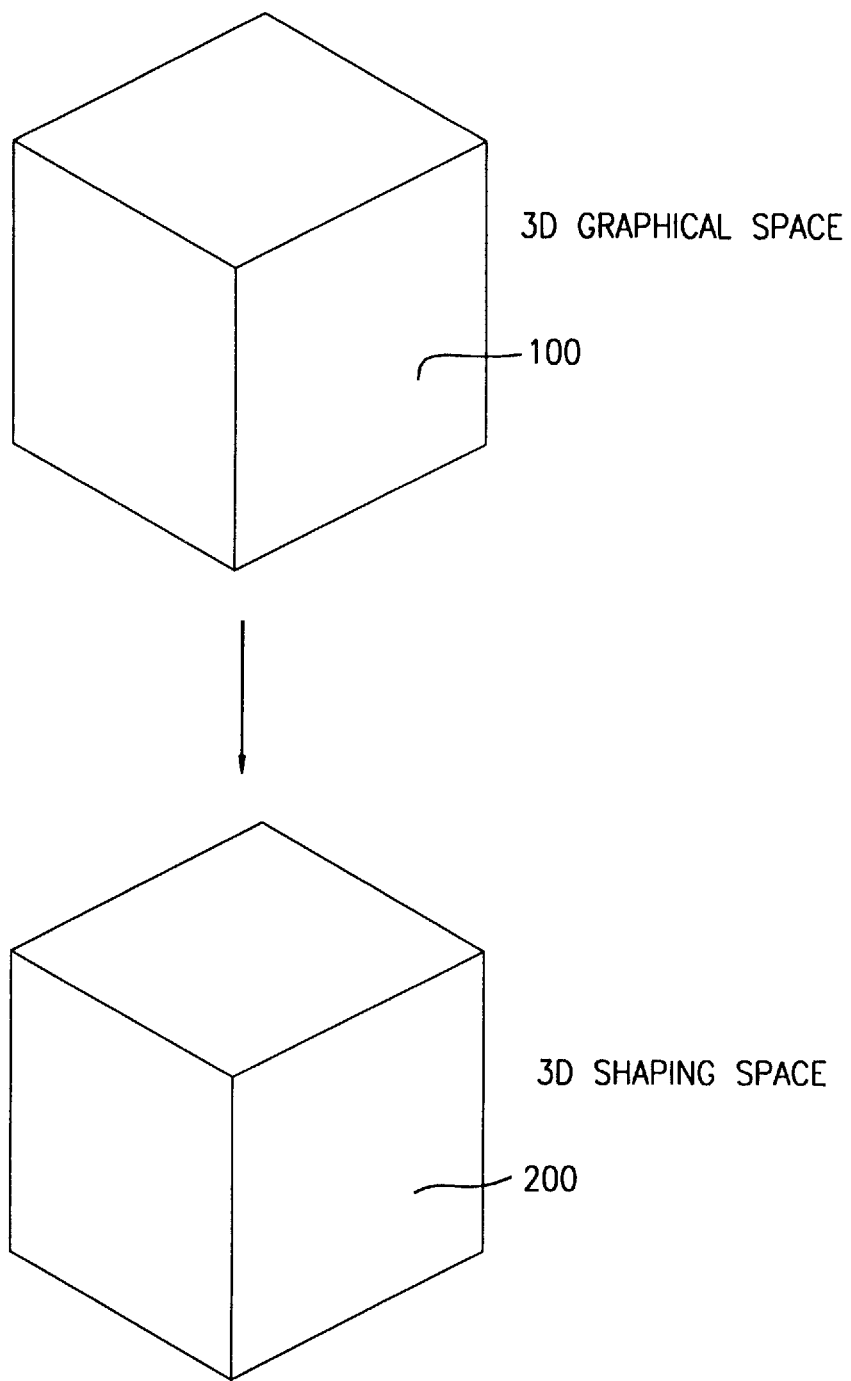
FIG. 4 is a view for use in describing a relationship between a three-dimensional graphics space and a shaping space in the embodiment.

FIG. 4 shows a relationship between the three-dimensional graphical space controlled by the three-dimensional graphics system 10 and a three-dimensional shaping space 200 controlled by the solid object generator 51. The three-dimensional cells in the three-dimensional graphical space 100 correspond to shaping elements in the three-dimensional shaping space 200. A single cell may correspond to a group of shaping elements. Alternatively, a group of cells may correspond to a single shaping element. Any other relationships may be applied.

The user is allowed to operate the three-dimensional graphics system 10 with dialogs by using the mouse device 13 and/or the keyboard 14 to change the attribute of the three-dimensional cells, thereby drawing a three-dimensional image.

[Three-dimensional graphics system]

Figure 5:
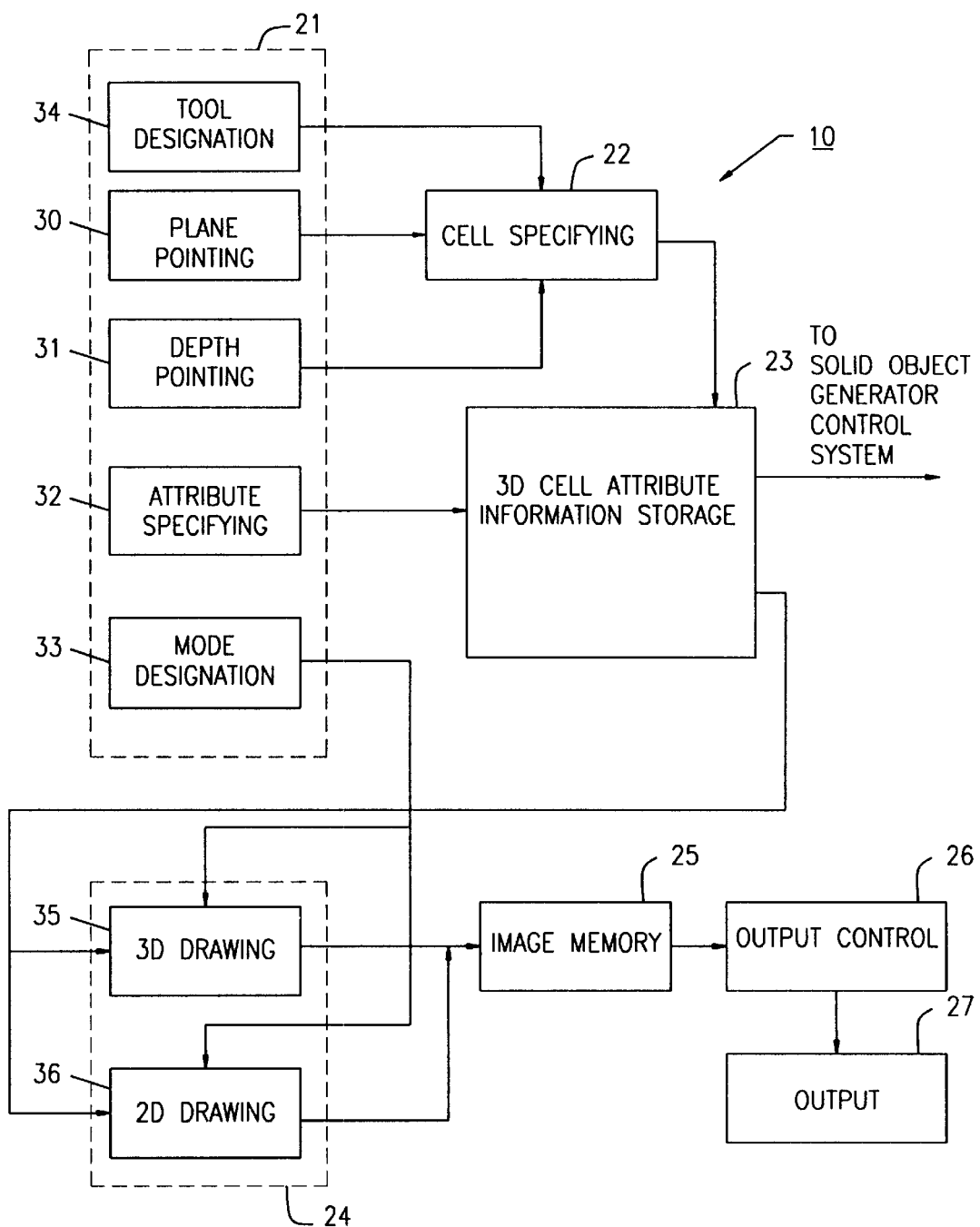
FIG. 5 is a block diagram showing an exemplified system configuration of the three-dimensional graphics system used in the embodiment.

FIG. 5 shows schematically the three-dimensional graphics system 10. In this figure, the three-dimensional graphics system 10 comprises an input unit 21, a three-dimensional cell specifying unit 22, a three-dimensional cell attribute information storage unit 23, a drawing unit 24, an image memory 25, an output control unit 26, and an output device 27. The input unit 21 comprises a plane pointing unit 30, an overall depth pointing unit 31, an attribute specifying unit 32, a mode designation unit 33, and a tool designation unit 34. The plane pointing unit 30 may be, for example, the mouse device 13 and is used for designating a point on the two-dimensional plane 102 shown in FIG. 3. The overall depth pointing unit 31 may be, for example, a predetermined set of keys on the keyboard such as up-headed and down-headed arrow keys. The overall depth pointing unit 31 is for designating a point along the overall depth 103 shown in FIG. 3. The attribute specifying unit 32 is for specifying an attribute of the three-dimensional cell 101 after being changed or modified. More specifically, the attribute specifying unit 32 specifies the attribute of the cell 101 in accordance with a designated command from a menu (palette) for attribute specification and/or a designated icon on the screen. The tool designation unit 34 is a tool for use in designating drawing characteristics of commands pictorially represented by, for example, a pencil, a brush, and a spray. The tool designation unit 34 is similar to that used in typical two-dimensional graphics systems. In response to the designation by the tool designation unit 34, the three-dimensional cell specified by the plane pointing unit 30 and the overall depth pointing unit 31 or a cell or cells in the vicinity thereof are determined to be changed in attribute. The pencil tool, when used, can designate a relatively small region in the vicinity of the specified cell, while the brush tool designates a relatively large region therearound. With the spray tool, a marginal processing mask is used to scattering by the spray. To determine which attribute is to be changed is carried out by the three-dimensional cell specifying unit 22 in accordance with outputs from the tool designation unit 34, the plane pointing unit 30, and the overall depth pointing unit 31. The tool designation unit 34 also contributes to specify the attribute in accordance with the designated command from the menu and/or the designated icon(s).

The three-dimensional cell attribute information storage unit 23 memorizes information indicative of the attribute of the three-dimensional cell 101. The three-dimensional cell attribute information storage unit 23 is also for use in replacing the attribute of the three-dimensional cell 101 specified by the cell specifying unit 22 with the attribute specified by the attribute specifying unit 32. At an initial state, all pieces of attribute information are blank or transparent. The attribute information may be memorized in any format. For example, the attribute information may be displayed as a one-dimensional array of attribute values, or as run lengths thereof.

A single cell may have two or more attributes. Examples of the attributes available include a temperature, a mass, and any other things in addition to the optical attributes such as colors. In addition, a characteristic or a feature of the cell may be held as the attribute. For example, a surface, a side, or an internal characteristic of the cell may be used as the attribute. The attribute associated with the surface may be, for example, an adhesion strength. The adhesion strength indicates how much force is required to separate two bonding surfaces. The attribute such as a temperature may be converted into the optical attribute such as luminance and hue, if necessary, for display.

The mode designation unit 33 is for designating operational modes in this embodiment. More specifically, the mode designation unit 33 determines a mode based on the designation on the menu and/or the icon(s). This embodiment has five operational modes: a pseudo three-dimensional input mode, a slice mode, a three-dimensional viewing mode, a rotation mode, and a frame feeding mode. Details of these modes are described below.

The drawing unit 24 is for drawing the three-dimensional cells 101 based on the attribute information stored in the three-dimensional cell attribute information storage unit 23. The drawing unit 24 comprises a three-dimensional drawing unit 35 and a two-dimensional drawing unit 36. The three-dimensional drawing unit 35 computes a data of a graphical image on the three-dimensional cell 101 by using a predetermined algorithm for output. A simplified image data prepared previously may be used for the drawing, if necessary. The two-dimensional drawing unit 36 generates an image data to display the state of the slices shown in FIG. 4 in a two-dimensional manner. For example, the two-dimensional drawing unit 36 may be similar in configuration to those used in conventional two-dimensional graphics systems based on bit maps.

The image memory 25 is for storing drawing data (bit map data) supplied from the drawing unit 24. The output control unit 26 controls the output device 27 such as a monitor or a printer to produce a graphical output in accordance with the drawing data.

Figure 8:
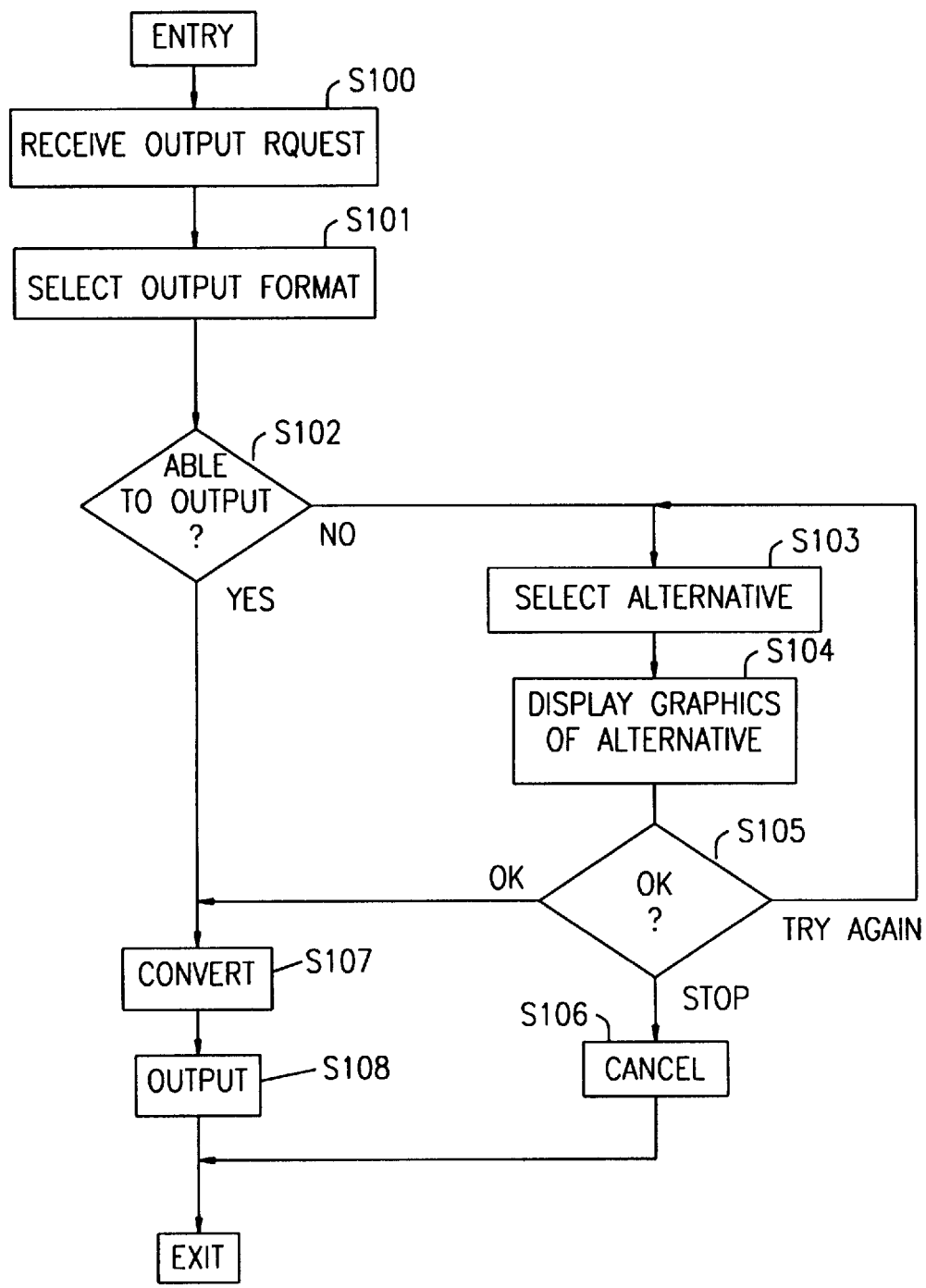
FIG. 8 is a flow chart for use in describing an operation of the solid object generator control system.

Next, the editing operation of the three-dimensional graphics system 10 is described. The editing operation is performed in for example pseudo three-dimensional input mode. FIG. 3 mentioned before shows the display in the pseudo three-dimensional input mode. The term "pseudo" is used herein because the two-dimensional plane 102 is seen in parallel to the screen surface and projection lines to project the overall depth are extended obliquely across the screen or a plane of projection (oblique projection) in the three-dimensional space in contrast to a typical perspective view (axonometric projection as shown in FIG. 8). This perspective is not scaled precisely but is enough to recognize locations in the three-dimensional space. In addition, the locations associated with the two-dimensional plane 102 can be entered in a user-friendly manner by using the mouse device 13 because the two-dimensional plane 102 is in parallel to or coincides with the screen of the monitor 12.

In this pseudo three-dimensional input mode, the three-dimensional drawing unit 35 is supplied with a command to draw a pseudo three-dimensional image and a drawing data of the pseudo three-dimensional image is generated.

For the drawing, a shape of a mouse cursor on the screen is changed to, for example, that of a pencil. The user operates the system by using this "pencil cursor." For example, the user may displace the location of the pencil cursor on the two-dimensional plane 102 by using the mouse device 13. The up-headed arrow key on the keyboard 14 is depressed to change the location in the direction of the overall depth. These operations may be carried out simultaneously just as the pencil cursor was moved across the three-dimensional space. In a drawing enable state defined by using a mouse button of the mouse device 13 or the like, the three-dimensional cells with an updated attribute are displayed as shown in FIG. 4 on the trace of the pencil cursor. With the pencil cursor, the attribute is changed only for the three-dimensional cells on the trace of the cursor. Of course, the attribute of a marginal cell or cells may be changed by means of settings. Drawing is made in a similar manner when the brush tool is used. The trace of the cursor changes the attribute of an increased number of three-dimensional cells when the brush tool is used. In addition, pattern fills or painting out may be carried out only by means of drawing a closed region and designating the inside thereof. The object drawn may be moved to change the attribute of the three-dimensional cell 101 on the trace to be same as the attribute of the moved object. A logical processing may also be carried out.

Thirty-two pieces aligned along the lower left side of the picture in FIG. 3 are for indicating the location in the direction of the overall depth. In the figure, the indication of "27" shows that the twenty-seventh position (i.e., the twenty-seventh slice) is designated. The pieces ahead of the twenty-seventh piece is displayed to be transparent or translucent. The location in the direction of the overall depth is indicated in this way for the user. To click (or depress the button of the mouse device 13 and release immediately) the piece allows direct designation of a target location or slice. Then, to move the cursor to the area within the designated slice changes the mouse cursor into the drawing tool such as the pencil cursor. In this state, the user can draw an image with the set attribute. As described above, it is possible to change the mode whether the drawing is made with the set attribute, by means of the mouse device 13 or the like.

The drawn object may be moved, copied or deleted by means of designating for each object or each cell. When the object is moved by designating the cell containing it, the adjacent cell or cells may be moved depending on the attribute of the adhesion strength described above between the cell surfaces. With the adhesion strength of a certain surface being enhanced, the cells on that surface are moved together. When the drawing objects are contact with each other (e.g., adjacent red and yellow drawing objects which may be defined by means of an object identifier held as the attribute), movement of one drawing object may cause the movement of the adjacent drawing object depending on the total adhesion strength of the cell surface at the boundary, if necessary.

[Solid object generator]

Figure 6:
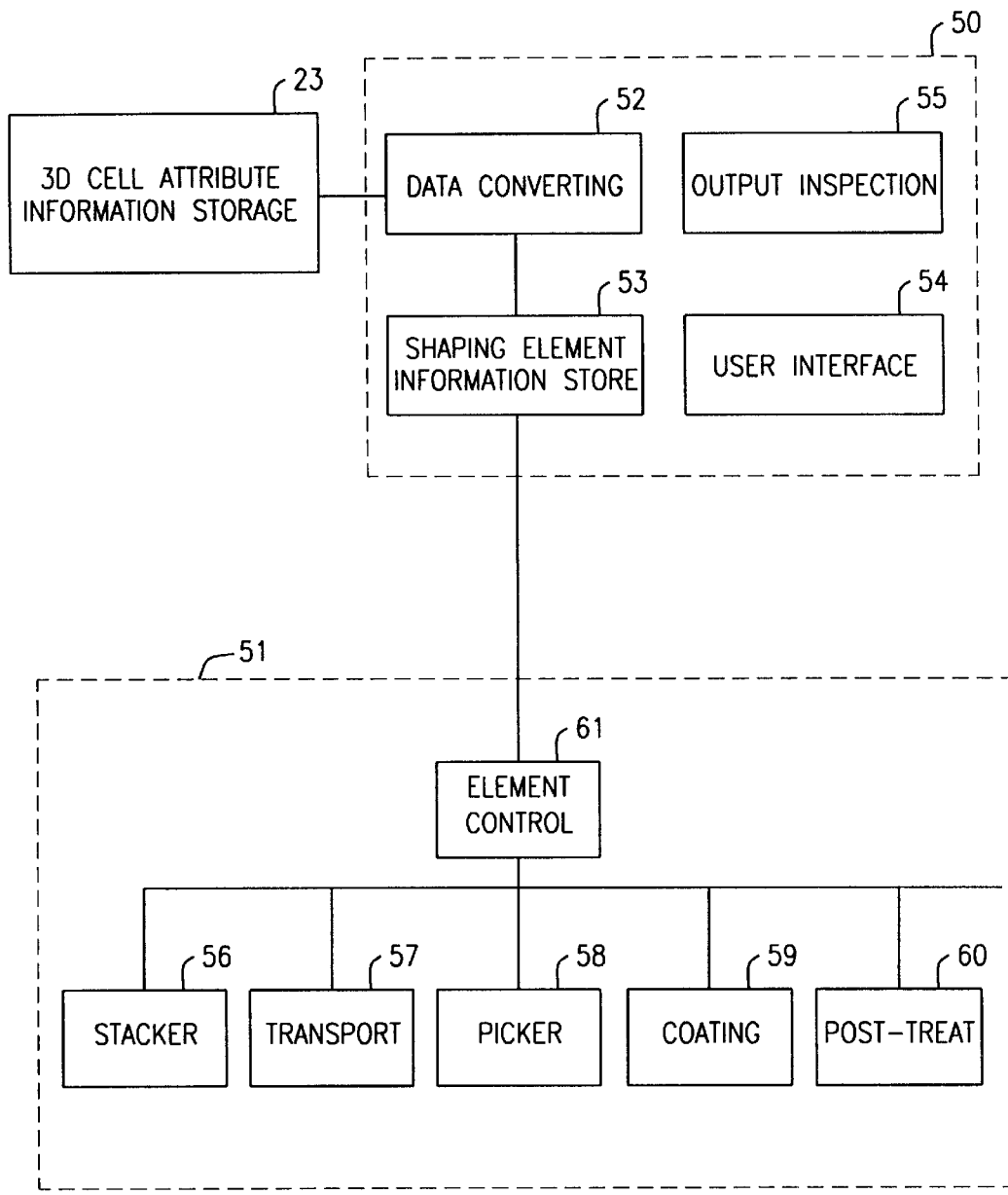
FIG. 6 is a block diagram of a solid object generator and a solid object generator control system according to the embodiment of the present invention.

FIG. 6 shows the solid object generator control system 50 and the solid object generator 51. In this figure, the solid object generator control system 50 comprises a data converting unit 52, a shaping element information storage unit 53, an output inspection unit 54, and a user interface unit 55. The solid object generator 51 comprises a stacker 56, a transportation unit 57, a picker 58, a coating unit 59, a post-treatment unit 60, and an element control unit 61 which controls the above mentioned elements.

Figure 7:
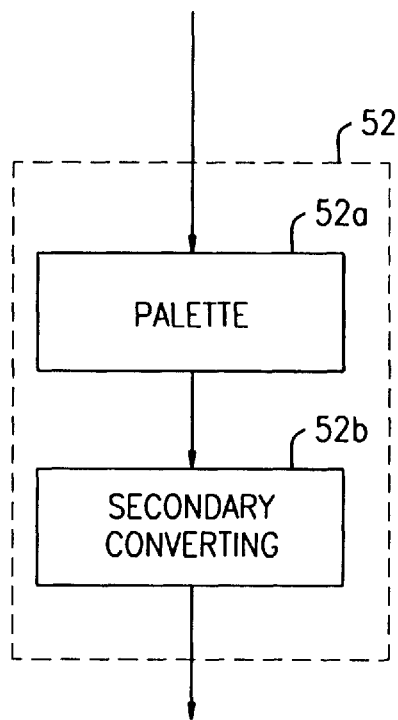
FIG. 7 is a block diagram of a converting unit 52 shown in FIG. 6.

The converting unit 52 of the solid object generator control system 50 comprises, as shown in FIG. 7, a palette 52a and a secondary converting unit 52b depending on output formats. The palette 52a is for determining the particle size or resolution of shaping elements each corresponding to ones or groups of the three-dimensional cells, and determining of which type (attribute) of the shaping element correspond to the attribute of the three-dimensional cell. For example, the palette 52a make a correspondence between the three-dimensional cell having an attribute "not colored" and a blank shaping element (no shaping element), and a correspondence between the three-dimensional cell having a color and the shaping element made of a material having that color. When two or more shaping elements correspond to a single cell because of a difference in scale between the three-dimensional cell and the shaping element, the type of the shaping element may be determined by majority.

The three-dimensional cell may hold various attributes such as a temperature and mass in addition to the optical attribute. The shaping may be performed with the attributes other than the optical attribute being combined with the shaping elements of various materials.

The secondary converting unit 52b is for changing modes depending on output formats. The output formats are as follows:

(1) Flower-in-water mode

A flower-in-water mode fills an entire working area with colored shaping elements and/or transparent shaping elements. More specifically, regions corresponding to the graphical elements are filled with the colored shaping elements, while transparent regions with no graphical element (i.e., regions having a null attribute or a transparent cell) are filled with the transparent shaping elements. As a result, the colored shaping elements corresponding to the graphical elements are covered with the transparent shaping elements, which is seen as a flower in water or an artificial flower that opens when placed in a glass of water. In this event, some colored shaping elements may be directly exposed to the outside.

(2) Non flower-in-water mode

A non flower-in-water mode is for generating an object without placing the shaping element at cells having a null attribute or transparent cells.

(3) Reinforced non flower-in-water mode

A reinforced non flower-in water mode generally places no shaping element at the cell having the null attribute or at the transparent cell as in the non flower-in-water mode. However, a transparent shaping element for reinforcement is placed on a desired region for holding a shaping element that otherwise may be fallen down.

(4) Mere stacking mode

A mere stacking mode lets shaping elements to go down when the elements are supported by no stable shaping element. A shaping element without any support is fallen down and stacked. The spatial arrangement of the three-dimensional cells in the original three-dimensional image is not good for the shaping element which is fallen down and stacked up.

(5) Presence and absence of pedestal

A pedestal may be provided in all the above mentioned modes. The shaping element in the lowermost layer are fixed to the pedestal. In the non flower-in-water mode, the reinforced non flower-in-water mode, and the mere stacking mode, two or more groups of the shaping elements may be separately arranged. In such a case, the groups or groups may be dispersed. With the pedestal, it is possible to fix integrally the two or more groups of the shaping elements even if they are arranged separately. In addition, the pedestal helps to produce a relatively stable shaped article by means of bonding only the shaping elements vertically adjacent to each other rather than bonding laterally adjacent ones. Therefore, a process of bonding with, for example, an adhesive, can be simplified.

The secondary converting unit 52b is for making a correspondence between the null or transparent attribute of the three-dimensional cell to a predetermined shaping element and for changing the arrangement of the shaping elements when in the mere stacking mode. The secondary converting unit 52b makes a correspondence between the transparent attribute of the three-dimensional cell to the transparent shaping element when in the flower-in-water mode. It detects a region to be reinforced and makes a correspondence between that region to the transparent shaping element when in the reinforced non flower-in-water mode. The secondary converting unit 52b moves the shaping element downward until it runs against something when in the mere stacking mode.

The user interface 55 allows users to select and enter an output format. FIG. 8 shows a flow chart carried out to select the output format and produce an output based on the format. In this figure, the user interface 55 selects the output format in response to a request for output (step S100). More specifically, the user interface 55 indicates a user choice of the output format. When the user selects any one of the output format, the user interface 55 receives a signal indicative of the selection from the user (Step S101). Next, the output inspection unit 54 determines whether the output format selected is available without any change to produce an output (step S102). If the step S102 is affirmative, the data converting unit 52 converts the attribute data for the three-dimensional cell into the attribute data (including the null one) for the shaping element (Step S107). If the step S102 is negative, the user interface 55 makes the user select an alternative output format. The user interface 55 then produces and displays a three-dimensional image representing the shaped article in the selected output format (Steps S103 and S104). The user is allowed to execute output, select another output format, or cancel the selection after he or she has a view of the image (Step S105). To select the output format again, the step S103 is executed again. For the cancellation, the operation is terminated without any further processing. To execute the output, the step S107 is carried out to convert the attribute data for the three-dimensional cell into the attribute data (including the null one) for the shaping element. After the data conversion, the solid object generator 51 is operated to produce the output.

For example, the output can be made at any time when the user selects the output format in the flower-in-water mode. The null three-dimensional cells are converted into the transparent shaping elements and other three-dimensional cells are converted into corresponding shaping elements. The solid object generator 51 produces an output according to the conversion results. On the contrary, when the user selects the output format in the non flower-in-water mode, the three-dimensional shaped article may not be produced correctly. In such a case, the output format is selected again. When the user selects the output format in the reinforced non flower-in-water mode, the three-dimensional shaped article may not be produced correctly if two or more groups of the shaping elements are dispersed. Should it happened, the user is required to select the output format again. Otherwise, the output operation is carried out without any change. When the user selects the output format in the mere stacking mode, the three-dimensional shaped article may not be produced correctly if two or more groups of the shaping elements are dispersed. In such a case, the output format is selected again. Otherwise, the output operation is carried out without any change.

Figure 9A:
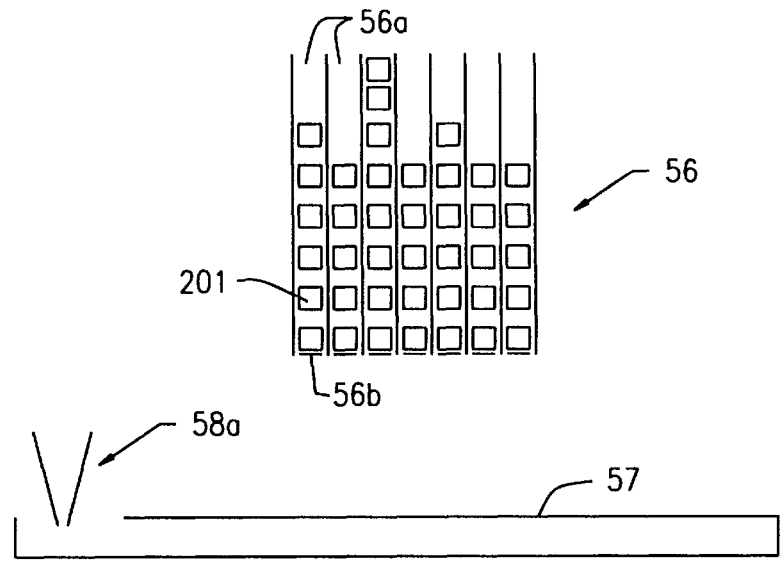
FIGS. 9(a)–(c) are views for use in describing an exemplified arrangement of the solid object generator.

Next, the solid object generator 51 is described. FIG. 9 is a view for use in describing mechanical structure of the stacker 56, the transportation unit 57, the picker 58 and the coating unit 59. In this figure, the stacker 56 comprises shaping element supply units 56a aligned in columns. The shaping element supply units 56a stores shaping elements 201 and falls the shaping element 201 one by one onto the transportation unit 57 when an actuator 56b is activated. Each shaping element supply unit 56a contains a corresponding kind of the shaping elements 201 to selectively fall the shaping element of the desired type onto the transportation unit 57. The transportation unit 57 transports the shaping elements 201 by using a difference in air pressure to a region under a picker nozzle 58a of the picker 58 in the direction from right to left in the figure. The picker nozzle 58a detects a fluctuation of the pressure when the shaping element 201 reaches under the picker nozzle 58a to determine the presence of the shaping element 201. The picker nozzle 58a then starts suction operation, i.e., it makes the inside vacuum to such the shaping element 201 to the tip of the nozzle to further transport the shaping element 201.

Figure 9B:
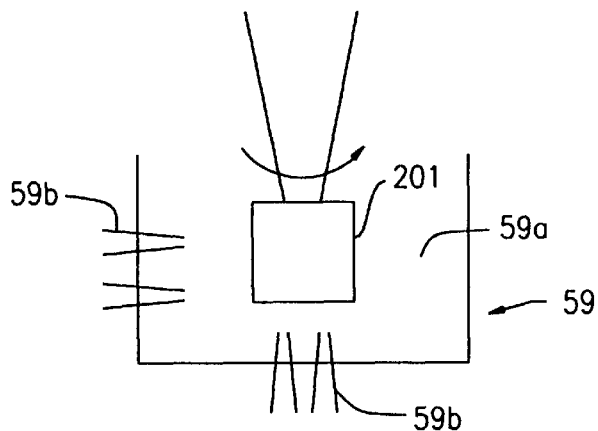
Figure 9C:
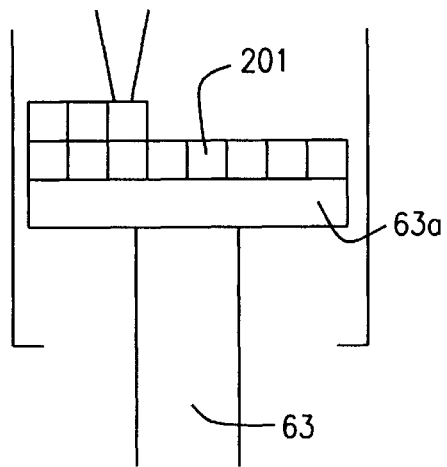
Figure 10A:
FIGS. 10(a)–(j) are views for use in describing an operation of the solid object generator.
Figure 10B:
Figure 10C:
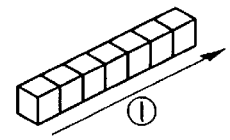
Figure 10D:
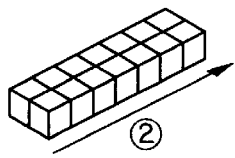
Figure 10E:
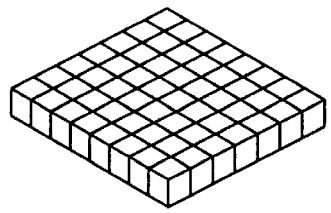
Figure 10F:
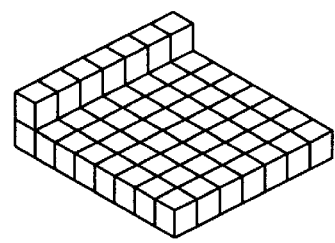
Figure 10G:
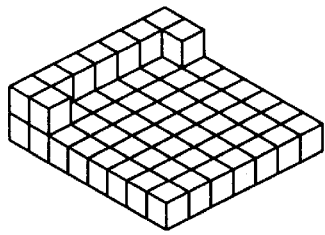
Figure 10H:
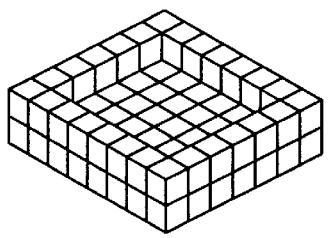
Figure 10I:
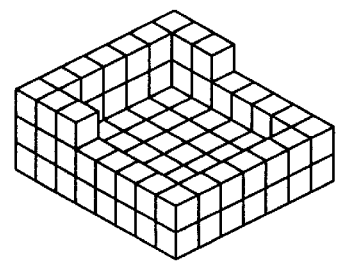
Figure 10J:
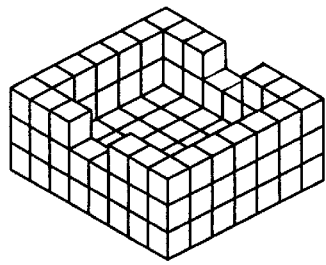
Figure 11A:
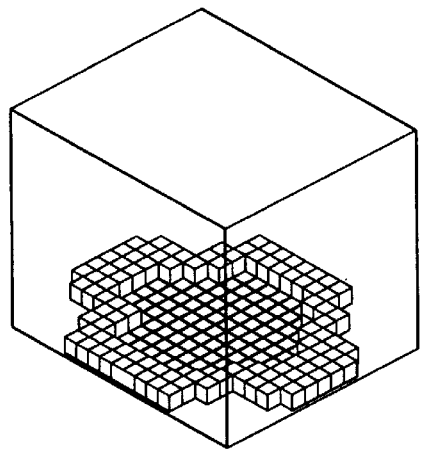
FIGS. 11(a)–(h) are additional views for use in describing an operation of the solid object generator.
Figure 11B:
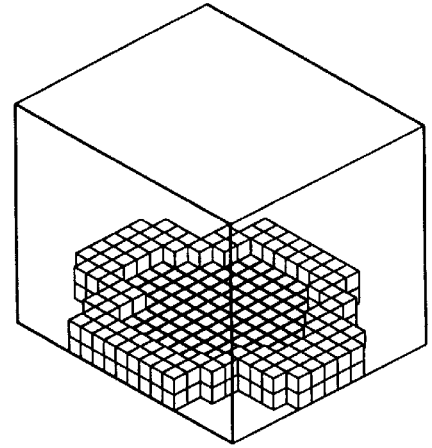
Figure 11C:
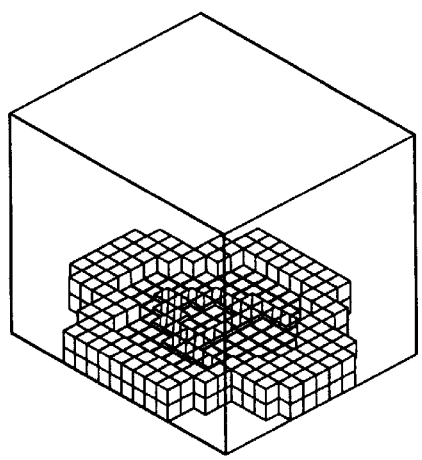
Figure 11D:
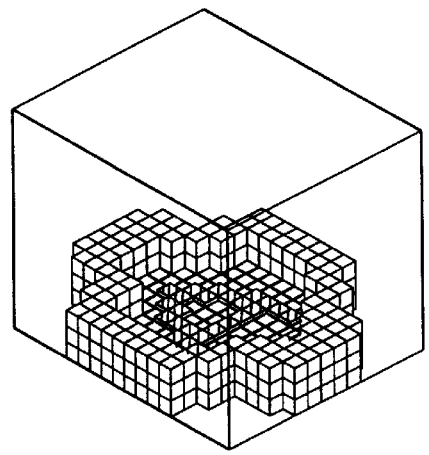
Figure 11E:
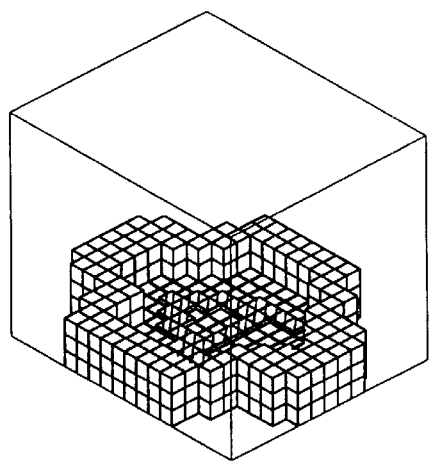
Figure 11F:
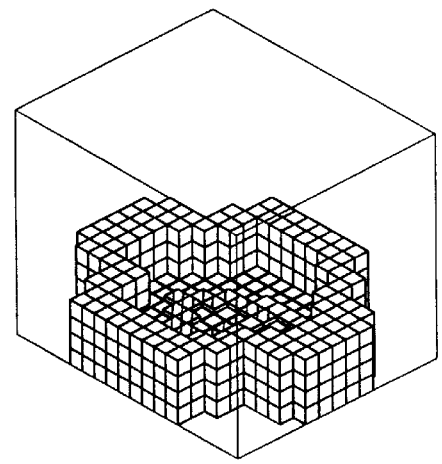
Figure 11G:
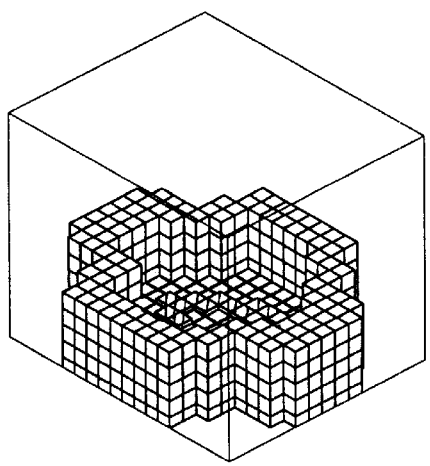
Figure 11H:
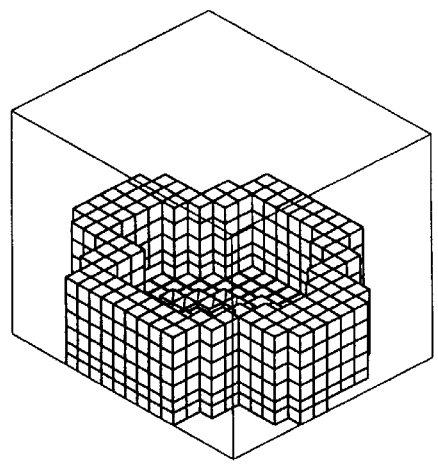

The picker nozzle 58a moves over the coating unit 59 as shown in FIG. 9(b). As a result of this movement, the shaping element 201 is positioned in an adhesive coating region 59a of the coating unit 59. A coating nozzle 59b applies an adhesive to the shaping element 201. The adhesive used may be, for example, a two-pack type. Rotation of the picker nozzle 58*a* results in application of the adhesive to a desired side surface. This process may be omitted for the output format that requires no application of the adhesive.

The picker nozzle 58*a* then travels into a working space 63 in which the shaping elements 201 coated with the adhesive are arranged or stacked up one by one. A pedestal 62 may be used as a base. The pedestal 62 may be placed on a substrate 63.

The shaping elements 201 are arranged and stacked successively in the manner described above. More specifically, as shown in FIG. 10, the shaping elements 201 are arranged successively from the front left as indicated by (1), (2), ..., for the lowermost layer. The shaping elements are also arranged successively from the front left for the second layer. This is repeated for all subsequent layers. The way of stacking the shaping elements 201 is changed depending on the output format.

In this manner, the shaped article as shown in FIG. 10(*j*) is eventually produced. This shaped article is an ashtray. In this example, a shaping space of 8 by 8 by 8 cells are used. Various post-treatments may be performed if necessary by means of the post-treating unit 60 shown in FIG. 6. For example, the shaped article may be wrapped with a transparent film or package, be subjected to heat treatment, or warned in hot water.

FIG. 11 shows an exemplified process of producing another shaped article. This example is for a case where an ashtray is produced in the shaping space of 32 by 32 by 32 cells.

The amount of the adhesive coated and whether the adhesive is coated or not may be determined or adjusted depending on the attribute of a bonding strength of a surface of the three-dimensional cell. For example, the bonding strength of the horizontal surfaces, i.e., the top and the bottom, may be enhanced while that of the vertical surfaces may be reduced. This provides a shaped article which has a vertical strength and will be divided relatively easily in other directions. The three-dimensional cells may be joined to each other by means of mating or engagement of a concavity and a convexity in and on the shaped element. In such a case, the presence of the concavity and the convexity correspond to the bonding strength of the surface.

[Output Format]

Next, specific examples of the output formats are described. The shaping element may be a cube or a rectangular parallelepiped. In the following description, a cubic shaping element is merely referred to as a shaping element without otherwise to be noted.

(a) Flower-in-water mode (no adhesive)

Transparent shaping element: An epoxy resin, an acrylic resin, or a hard glass.

Colored shaping element: A plastic material for plastic models having good color developing properties.

Adhesive: None (the adjacent surfaces of the shaping elements are not adhered to each other).

How to shape: Both the colored and transparent shaping elements are dealt with equally and arranged in the shaping space. After the shaping elements are stacked up, the elements are surrounded and fixed by transparent plate members. Therefore, no adhesion between the shaping elements is required.

How to fix: The shaping elements are stacked up one by one from the bottom to form a cube filling the shaping space. The cube is surrounded by six square plate members of colorless and transparent epoxy resin, acrylic resin, or hard glass. These six square plate members are adhered to each other along the sides of the cube. The cubic shaped article is thus just as being placed in a cubic water tank. A problem of poor appearance due to a change of a refractive index may be solved by using the same material for both the plate members and the transparent shaping elements.

Advantage: Shaping can be made only by means of a simple mechanical operation without any temperature change. The shaping elements may be reused by breaking the outer casing when the shaped article becomes useless.

(b) Flower-in-water mode (with adhesive)

Transparent shaping element: An epoxy resin, an acrylic resin, or a hard glass.

Colored shaping element: A plastic material for plastic models having good color developing properties.

Adhesive: An epoxy resin adhesive (two-pack type).

How to shape: Both the colored and transparent shaping elements are dealt with equally and arranged in the shaping space.

How to fix: The shaping elements are stacked up one by one from the bottom. The adjacent surfaces of the shaping elements are bonded with the adhesive during the stacking process.

Advantage: Shaping can be made only by means of a simple mechanical operation without any temperature change.

(c) Colored plastic mere stacking mode (with pedestal)

Transparent shaping element: None.

Colored shaping element: A plastic material for plastic models having good color developing properties.

Adhesive: An epoxy resin adhesive (two-pack type).

How to shape: The colored shaping elements are arranged and stacked up from the lowermost layer on a pedestal. The pedestal may be made of any material as long as it can be adhered to the colored shaping elements with an adhesive to provide a satisfactory strength. When a non-transparent three-dimensional cell is present on the transparent three-dimensional cell in the three-dimensional image of an article to be shaped, the non-transparent three-dimensional cell is shifted downward to ensure that each colored shaping element is supported by other colored shaping element(s) and/or the pedestal. The original spatial arrangement of the three-dimensional cell is not held when it is shifted downward.

How to fix: The lowermost shaping elements are placed on the pedestal by means of a robot-like operation. In this stage, the epoxy resin adhesive (two-pack type) is applied to the bottom surface of each shaping element just before it is placed on the pedestal. A main component and a curing agent are mixed when applied to the surface. A low pressure is applied to the shaping element immediately after it is placed on the pedestal to ensure the adhesion therebetween. Next, the shaping elements of the second layer from the bottom are placed in a similar manner. The above processes are repeated subsequently.

Advantage: The pedestal contributes to maintain the arrangement of the entire structural elements without bonding with an adhesive between the adjacent side surfaces of the shaping elements. The time required for shaping is reduced when no side-by-side bonding is made as compared with a case where the shaping elements are bonded side by side.

(d) Colored plastic mere stacking mode (without pedestal)

Transparent shaping element: None.

Colored shaping element: A plastic material for plastic models having good color developing properties.

Adhesive: An epoxy resin adhesive (two-pack type).

How to shape: The colored shaping elements are arranged and stacked up from the lowermost layer on a pedestal. This process is similar to that described in (c) except that there is no pedestal.

How to fix: Attributes are calculated previously for all shaping elements to be shaped, in which the attributes indicate whether a given shaping element is adjacent to a colored shaping element on the back or left surface thereof. Next, the shaping elements composing the bottom layer are placed in order from the left of the row at the depth on the floor of the working space by means of a robot-like operation. In this stage, the epoxy resin adhesive (two-pack type) is applied to the surface of each shaping element adjacent to the shaping element on the back or left thereof, if any, just before it is placed on. A main component and a curing agent are mixed when applied to the surface. Next, the shaping elements of the second shaping layer from the bottom are placed on from the left of the row at the depth on the shaping elements of the first layer, in a similar manner by means of a robot-like operation. In this stage, the epoxy resin adhesive (two-pack type) is applied to the bottom surface of each shaping element just before it is placed on. In addition, the epoxy resin adhesive (two-pack type) is also applied to the surface of each shaping element adjacent to the shaping element on the back or left thereof, if any, just before it is placed on. The main component and the curing agent are mixed when applied to the surface. A low pressure is applied to the shaping element immediately after it is placed on to ensure the adhesion therebetween. Then, the shaping elements of the third shaping layer from the bottom are placed on in a similar manner. The above processes are repeated subsequently.

Advantage: No pedestal is required. Bonding is made on the side surfaces to improve the strength.

(e) Reinforced non flower-in-water mode (with pedestal)

Transparent shaping element for reinforcement: An epoxy resin, an acrylic resin, or a hard glass.

Colored shaping element: A plastic material for plastic models having good color developing properties.

Adhesive: An epoxy resin adhesive (two-pack type).

How to shape: The transparent three-dimensional cells are divided into two types when it is represented only as a three-dimensional image data. Assuming that the shaping space has a ceiling surface and a floor surface, "transparent shaping elements A" represent those filling a line segment from the ceiling surface to the colored shaping element that the transparent shaping element encounters first, for the line segment connecting between one shaping element on the floor surface and one corresponding shaping element on the ceiling surface. All of other transparent shaping elements on the line segment other than the "transparent shaping elements A" are referred to as "transparent shaping elements B". All shaping elements are referred to as the "transparent shaping elements A" when the line segment of the shaping elements does not meet a colored shaping element. The "transparent shaping elements B" serve to support the colored shaping element(s) they meet, so that they are produced as the shaping elements. However, these elements are invisible because they are transparent. In other words, the "transparent shaping elements B" are like a wirepuller or a person behind the scenes. They are produced as the transparent shaping elements for reinforcement. On the contrary, the "transparent shaping elements A" are not produced because to do so is totally unnecessary. In other words, the "transparent shaping elements A" correspond to "no shaping element".

The pedestal may be made of any material as long as it can be adhered to the colored shaping elements with an adhesive to provide a satisfactory strength.

How to fix: The transparent shaping elements A (no shaping elements) and the transparent shaping elements B are calculated first. Next, the colored shaping elements and the transparent shaping elements B are placed on the pedestal by means of a robot-like operation out of the shaping elements composing the lowermost layer. In this stage, the epoxy resin adhesive (two-pack type) is applied to the bottom surface of each shaping element just before it is placed on the pedestal. A main component and a curing agent are mixed when applied to the surface. A low pressure is applied to the shaping element immediately after it is placed on the pedestal to ensure the adhesion therebetween. Next, the shaping elements of the second layer from the bottom are placed in a similar manner. The above processes are repeated subsequently.

Advantage: The pedestal contributes to maintain the arrangement of the entire structural elements without bonding with an adhesive between the adjacent side surfaces of the shaping elements. The time required for shaping is reduced when no side-by-side bonding is made as compared with a case where the shaping elements are bonded side by side. In addition, the transparent shaping elements for reinforcement allows shaping of interspersed colored shaping elements and a shaping element having a shape of a hanging bell.

(f) Reinforced non flower-in-water mode

Transparent shaping element for reinforcement: An epoxy resin, an acrylic resin, or a hard glass.

Colored shaping element: A plastic material for plastic models having good color developing properties.

Adhesive: An epoxy resin adhesive (two-pack type).

How to shape and how to fix: Similar to those described in (e) except that the shaping elements are neither shaped on nor fixed to the pedestal.

(g) flower-in-water/transparent shaping element removal mode (general)

Transparent shaping element (for filling): Paraffin wax.

Colored shaping element: Colored silicone resin or the like.

Adhesive: An epoxy resin adhesive (two-pack type).

How to shape: The shaping process is divided into primary and secondary stages. In the primary stage, both colored and transparent shaping elements are dealt with equally as in the above mentioned flower-in-water mode except that the transparent shaping elements are temporarily filled in a space other than that for the shaped article. The transparent shaping elements are removed in the secondary stage and a substantial shaped article is taken out. Unlike the case in the flower-in-water mode, the adhesive is applied to the adjacent surfaces of the colored shaping elements for the secondary stage.

<Primary Stage>
1. Attributes are calculated previously for colored shaping elements to be shaped to determine whether a given shaping element is adjacent to a colored shaping element on the bottom, back or left surface thereof.
2. The shaping elements composing the lowermost layer are placed in order from the left of the row at the depth on the floor of the working space by means of a robot-like operation, without distinguishing the transparent shaping element. (for filling) and the colored shaping element. In this stage, the epoxy resin adhesive (two-pack type) is applied to the surface of each colored shaping element adjacent to the colored shaping element on the back or left thereof, if any, just before it is placed on. A main component and a curing agent are mixed when applied to the surface.
3. The shaping elements composing the second layer from the bottom are placed in order from the left of the row at the depth on the floor of the working space by means of a robot-like operation, without distinguishing the transparent shaping element (for filling) and the colored shaping element. In this stage, the epoxy resin adhesive (two-pack type) is applied to the surface of each colored shaping element adjacent to the colored shaping element on the back or left thereof, if any, just before it is placed on. A main component and a curing agent are mixed when applied to the surface.
4. The shaping elements composing the third layer from the bottom are placed on in a similar manner. The above processes are repeated subsequently.
5. When a predetermined space is shaped, a pressure is applied to the outer six surfaces to ensure complete adhesion.

<Secondary Stage>
6. A predetermined assembly is taken out of the working space after the colored shaping elements are adhered to each other. In this event, the transparent shaping elements for reinforcement which are surrounding the object formed of the colored shaping elements are spontaneously separated from the colored shaping elements.
7. However, some transparent shaping elements for reinforcement are not separated spontaneously that are in a narrow gap or that are filled in a cavity of an object having a shape similar to a pot with a small mouthpiece. The shaped article is then heated by means of, for example, placing it in hot water to melt the transparent shaping elements for reinforcement that are made of the paraffin wax. The remaining transparent shaping elements can thus be flown out of the gap or the cavity and completely separated from the colored shaping elements. A temperature of the hot water is determined to be within a range higher than the melting point of the paraffin wax of 50°–55° C. and lower than the heat resistance temperature of the silicone resin of 180°–200° C. The epoxy resin adhesive has heat resistance after being cured completely, so that the heating operation does not affect the adhesion between the colored shaping elements.

Advantage: The transparent shaping elements can finally be considered as "none" without processing data indicative of downward shifting of the three-dimensional cells carried out in the mere stacking mode of (c) and (d). If the adhesive got on the wax during the primary stage, it is easy to remove such adhesive by means of melting the paraffin wax. The paraffin wax of the shaping element for reinforcement may be reused as it is or after being formed into another shape.

(h) Flower-in-water/transparent shaping element removal mode (practical metal type)

Transparent shaping element (for filling): Pumice stone (or paraffin wax).
Metal shaping element: Available metals are iron, zinc, and aluminum.
Adhesive: An anaerobic adhesive.
How to shape: Similar to that described in the section (g) above.
How to fix: Fixed according to the following processes.

<Primary Stage>
1. The shaping elements composing the lowermost layer are placed in order from the left of the row at the depth on the floor of the working space by means of a robot-like operation, without distinguishing the transparent shaping element (for filling) and the metal shaping element. In this stage, a small gap is ensured between the adjacent shaping elements. A sufficient amount of the anaerobic adhesive is coated or distributed over the entire surface of the layer.
2. The shaping elements composing the second layer from the bottom are placed in a similar manner. A sufficient amount of the anaerobic adhesive is coated or distributed over the entire surface of the layer. The above processes are repeated subsequently.
3. After the all shaping elements are placed on in the shaping space, a sufficient amount of the anaerobic adhesive is poured into the gaps between the shaping elements.
4. An excessive anaerobic adhesive is removed and a pressure is applied to the outer six surfaces to ensure complete adhesion. The gaps between the shaping elements are eliminated at this stage.

<Secondary Stage>
5. A predetermined assembly is taken out of the working space after the metal shaping elements are adhered to each other. In this event, the transparent shaping elements for reinforcement which are surrounding the object formed of the metal shaping elements are spontaneously separated therefrom because it is formed of a porous pumice stone and is not adhered to.

Advantage: It is not necessary to have previously the attributes of the information on the adjacent shaping elements. The adhesive is applied uniformly rather than selectively. The process can thus be simplified. Simplification of the process of coating the adhesive makes minute works unnecessary in practical applications. Accordingly, it is possible to reduce the size of the shaping elements, improving practicability thereof. There is no chance for the paraffin wax to adhere as a thin film. The anaerobic adhesive not cured may be washed out. The pumice stone used for the transparent shaping element for reinforcement can be reused.

(i) Molding technique, single material mode

Transparent shaping element: Solder or the like.
Substantial shaping element: Paraffin wax (primary) and epoxy resin or the like (tertiary).
Adhesive: An epoxy resin adhesive (two-pack type).
How to shape: A shaping process is divided into primary, secondary and tertiary stages. Both the substantial and transparent shaping elements are dealt with equally as in the above mentioned flower-in-water mode in the primary stage. The transparent shaping elements are used as a mold. The adhesive is applied to the surfaces of the adjacent transparent shaping elements or all shaping elements for the secondary stage. The secondary stage removes the primary substantial shaping elements (paraffin wax) used as the filling material. The epoxy resin is poured into gaps generated as a result of the above removal and is cured therein. Furthermore, the transparent shaping elements (for a mold) is removed, if necessary.

How to fix: Fixed according to the following processes.

<Primary Stage>

1. It is necessary for the data to be prepared assuming that a shaped article is formed using the molding technique. The preparation of the data is left to a user's discretion but it is required that an inlet is opened outside.
2. The shaping elements composing the lowermost layer are placed in order from the left of the row at the depth on the floor of the working space by means of a robot-like operation, without distinguishing the transparent shaping element (for filling) and the metal shaping element.
3. The subsequent processes depend on whether the adhesive is applied to only the surfaces of the adjacent shaping elements or to all shaping elements. The only requirement is that the transparent shaping elements are bonded firmly.
4. When all shaping elements are produced, a pressure is applied to the outer six surfaces to ensure complete adhesion.

<Secondary Stage>

5. After the completion of bonding between the transparent shaping elements for a mold, the shaped article is then heated by means of, for example, placing it in hot water to melt the primary transparent shaping elements that are made of the paraffin wax. The paraffin wax is molten and flown out, leaving a substantial gap there. Sand may be poured into the substantial gap and the entire article is shaken. The sand is then taken out to remove the adhesive that may be adhered to the inner wall of the gap.

<Tertiary Stage>

6. A cast epoxy resin is poured together with a curing agent into the gap generated in the previous process 5. It is waited for the resin to cure.
7. The mold is broken, if necessary, to take out a target shaped article. Only the mold can be broken selectively. For example, the mold may be heated to a temperature higher than 180° C. when it is made of solder.

Advantage: The target shaped article can be taken out as a single product that has no bonded portion. As a result, the strength is improved and a tree-like article having a complicated shape can be produced at ease. The bonding free structure results in better appearance. The adhesion between the transparent shaping elements for a mold is not directly related to the strength, so that the shaping elements are fit for practical use even if they are not completely bonded to each other. The paraffin wax and the solder may be reused from a physical viewpoint though they may be casted again as the shaping elements.

(j) Color clay pressure bonding mode

Transparent shaping element (for filling): Urethane sponge.

Colored shaping element: Industrial clays having an intermediate shape between a sphere and a cube rather than a complete cube (various colors).

Adhesive: none.

How to shape: Each shaping element does not have a complete cubic shape at first. The colored shaping elements are aligned with a gap between the adjacent ones. The colored shaping elements are adhered to each other because of a physical property of the clay when they are pressurized from six directions. This mode belongs in principle to the flower-in-water/transparent shaping element removal modes ((g) and (h)) and the process is divided into primary and secondary stages. In the primary stage, the colored and transparent shaping elements are dealt with equally to produce an output of the flower-in-water mode. The transparent shaping elements are used only as a filling material. No adhesive is applied to. In the secondary stage, the transparent shaping elements (for filling) are removed.

<Primary Stage>

1. A predetermined assembly is stacked up from the bottom.
2. The colored shaping elements of the industrial clay are softened well by means of, for example, placed in hot water. The shaped article is pressurized from six directions. The pressure is continuously applied until the shaping elements are extended to fill the gaps.

<Secondary Stage>

3. The shaped article is cooled to a normal temperature after the completion of the pressurization. The shaped article is taken out of the working space when the industrial clay returns to its original hardness. In this event, the transparent shaping elements made of the urethane sponge are spontaneously separated from the colored shaping elements. The industrial clay may be replaced with a so-called hardened clay which is hardened when dried by air or sintered.

Advantage: It is possible to prevent the process from being complicated because no adhesive is used. The urethane sponge of the transparent shaping elements (for filling) can be reused.

(k) Black-and-white linear rigid body shaping element mode (adhesive solution two-direction-coating mode)

Transparent shaping element (for filling): Paraffin wax.

Black-and-white shaping element/linear rigid body shaping element: metal or the like.

Adhesive: An epoxy resin adhesive (two-pack type).

How to shape (strengthened type using linear rigid body shaping elements): The key point of this method is to use a concept of a straight line rather than a point for the shaping elements. More specifically, a single three-dimensional shaping element is represented herein as 1 by 1 by 1. A "linear rigid body shaping element" is formed on site by means of either preparing the linear (rectangular parallelepiped) rigid body shaping elements of 1 by 1 by 2, 1 by 1 by 3, . . . , 1 by 1 by n as well as of 1 by 1 by 1 or preparing an elongated rigid shaping element rod having a cross section of 1 by 1 formed like a wire coil and cutting an adequate length of the rod by means of laser. A sufficient strength can be achieved easily by using a technique similar to that used to produce plywood by means of rotating layers of the rigid body by 90 degrees for each layer. This mode belongs in principle to the flower-in-water/transparent shaping element removal mode and the process is divided into two stages. More specifically, the colored and transparent shaping elements are dealt with equally to shape as in the flower-in-water mode in the primary stage. In the secondary stage, the transparent shaping elements (for filling) are removed. The shaped article is made of a single black-and-white material. An adhesive solution is coated on the linear rigid body shaping elements from two directions.

How to fix: Fixed according to the following processes.

<Primary Stage>

1. First, an axial direction for the shaping is determined. This direction may be determined by a user, but it is preferable to calculate previously an efficient axial direction by using a computer or a shaper to obtain the maximum strength of the resultant shaped article because the strength becomes higher with a larger number of the linear rigid bodies of as long as possible to decrease the total number of the shaping elements. The shaping is preferably made considering the calculation result. An inner state of an object is not so much important for the practical applications, so that it is preferable to bury previously the transparent shaping elements completely surrounded by the black-and-white shaping elements to provide more advantages of the linear rigid body shaping elements.

2. It is necessary that the data is modified as those suitable for the linear rigid body shaping elements.

3. The shaping elements composing the lowermost layer are placed in order from the left of the row at the depth on the floor of the working space by means of a robot-like operation. In this event, the transparent shaping elements are placed on merely in order. On the other hand, the black-and-white shaping elements are placed on as the linear rigid body shaping element(s). In other words, the linear rigid body shaping element consists of a certain number of the black-and-white shaping elements. The linear rigid body shaping element may be cut previously to have a desired length. Alternatively, it may be cut by the laser on site. In this process, the black-and-white linear rigid body shaping elements are placed on just after the adhesive is applied to their back and bottom surfaces. A floor surface supporting the working space is a base made of the paraffin wax which can be replaced with. The black-and-white linear rigid body shaping elements receive a pressure obliquely applied thereto from the above and right ahead after they are arranged to ensure higher bonding with the adhesive.

4. Subsequently, the second layer is formed in a similar manner after the first layer is completed. It is noted that the shaping elements composing the second layer are placed on from the depth of the leftmost column. This results in directional shifting between the first and second layers by 90 degrees. Similar processes are repeated for the third, fourth, . . . and subsequent layers.

<Secondary Stage>

5. The shaped article is taken out of the working space after the completion of the bonding between the adjacent black-and-white linear rigid body shaping elements. In this event, the transparent shaping elements for filling made of the paraffin wax may be separated spontaneously from the black-and-white object when they are located outside the object made of the black-and-white linear rigid body shaping elements and are not coated with the adhesive.

6. However, some transparent shaping elements may be bonded to the black-and-white object with the adhesive. In addition, such transparent shaping elements are not separated spontaneously from the black-and-white object that are in a narrow gap or that are filled in a cavity of an object having a shape similar to a pot with a small mouthpiece. The shaped article is thus heated by means of, for example, placing it in hot water to melt the transparent shaping elements made of the paraffin wax. The remaining transparent shaping elements can thus be flown out of the gap or the cavity and completely removed.

Advantage: Significant improvement of the strength can be expected by using the linear rigid body shaping elements. This strength can be maintained even when the bonding with the adhesive is not complete. In addition, it is possible to reduce the size of each shaping element and increase that of the predetermined assembly when using the method of cutting the linear rigid body shaping elements on site by means of the laser.

(1) Black-and-white linear rigid body shaping element mode (adhesive solution one-direction-coating or spraying mode)

Transparent shaping element (for filling): Paraffin wax.

Black-and-white shaping element/linear rigid body shaping element: metal or the like.

Adhesive: An epoxy resin adhesive (two-pack type) or the like.

How to shape: This is fundamentally similar to the section (k) except that the adhesive solution is applied to or sprayed on the shaping elements from one direction. More specifically, when a single three-dimensional shaping element is represented as 1 by 1 by 1, the shaper of the present invention has a data of two 0.5 by 1 by 1 shaping elements. For the linear rigid body shaping elements, they are formed on site by means of either preparing the linear (rectangular parallelepiped) rigid body shaping elements of 0.5 by 1 by 2, 0.5 by 1 by 3, . . . , 0.5 by 1 by n or preparing an elongated rigid shaping element rod having a cross section of 0.5 by 1 formed like a wire coil and cutting an adequate length of the rod by means of laser. In this mode, the adhesive is applied to or sprayed on the shaping elements from above in bulk every time when one layer (more strictly, 0.5 layers in terms of the length) is completed in order to simplify the process of applying the adhesive solution.

How to fix: Fixed according to the following processes.

<Primary Stage>

1. First, an axial direction for the shaping is determined. This is similar to the process described in the section (k).

2. It is necessary that the data is modified as those suitable for the linear rigid body shaping elements. In this event, when the single three-dimensional shaping element is represented as 1 by 1 by 1, the shaper of the present invention has the data of two 0.5 by 1 by 1 shaping elements.

3. The shaping elements are those having half a length of one layer in a strict sense. The shaping elements composing the lowermost layer (0–0.5 layers) are placed in order from the left of the row at the depth on the floor of the working space by means of a robot-like operation. In this event, the transparent shaping elements are placed on merely in order. On the other hand, the black-and-white shaping elements are placed on as the linear rigid body shaping element(s). In other words, the linear rigid body shaping element consists of a certain number of the black-and-white shaping elements. The linear rigid body shaping element may be cut previously to have a desired length. Alternatively, it may be cut by the laser on site.

4. An adhesive solution is applied to or sprayed on the entire exposed surfaces of the shaping elements from above after the first layer (corresponding to 0.5 layers).

5. Subsequently, the black-and-white shaping elements/linear rigid body shaping elements composing the second layer is placed on the first layer. In this event, the shaping elements composing the second layer are placed on from the depth of the leftmost column. This results in directional shifting between the first layer (0–0.5 layers) and the second layer (0.5–1.0 layer) by 90 degrees. When considered about the original data, there is no possibility at this stage that any adjacent black-and-white shaping elements (1 by 1 by 1) are not bonded to each other.

6. Similar processes are repeated for the third layer (1.0–1.5 layers) and the subsequent layers.

7. A predetermined assembly is shaped completely.

<Secondary Stage>

8. The shaped article is taken out of the working space after the completion of the bonding between the adjacent black-and-white shaping elements/linear rigid body shaping elements. The shaped article is then heated by means of, for example, placing it in hot water to melt the transparent shaping elements made of the paraffin wax. The remaining transparent shaping elements can thus be flown out and completely removed.

Advantage: Significant improvement of the strength can be expected by using the linear rigid body shaping elements as in the mode described in the section (k). It is possible to reduce the size of each shaping element and increase that of the predetermined assembly when using the method of cutting the linear rigid body shaping elements on site by means of the laser. In addition, it is unnecessary to apply the adhesive to each of the black-and-white shaping elements/linear rigid body shaping elements just before the elements are arranged, which is necessary for the case of (j). Therefore, a bothersome operation for the application of the adhesive can be eliminated, which reduces more and more the size of each shaping element and increase that of the predetermined assembly.

(m) Colored linear rigid body shaping element mode (adhesive solution three-direction-coating mode)

Transparent shaping element (for filling): Paraffin wax.

Colored shaping element/linear rigid body shaping element: silicone or the like.

Adhesive: An epoxy resin adhesive (two-pack type) or the like.

How to shape: This is fundamentally similar to the section (k). Differences are described. A user does not require internal structures, so that information on the color(s) of the inside not contacts with the surfaces are modified to facilitate the shaping while keeping intact the data for the shaping elements forming the surfaces of the object. More specifically, it is assumed that one inner row has four shaping elements of red, yellow, green, and blue. These elements are completely encapsulated in the object without contacting with those forming the surfaces. In such a case, the user does not require that the data indicates green or yellow. Therefore, the "yellow" and "green" data are replaced with "red" and "blue" data, respectively, to provide the row of red, red, blue, and blue shaping elements. This allows the system to take out only the red linear rigid body shaping element of 1 by 1 by 2 and the blue linear rigid body shaping element of 1 by 1 by 2. This is for the case where the row is formed of the even number (in this case, four) of the shaping elements. When the number of the shaping elements is odd, they may be taken out as 1 by 1 by 2.5 or as 1 by 1 by 3 and 1 by 1 by 2. In the latter case, there may be a certain rule to which "3" is applied and to which "2" is applied. Alternatively, it is possible to determine it depending on the case to ensure uniform distribution of the shaping elements, considering the remaining number of the shaping elements.

The single material is used in the case of (k) while two or more materials are used in this mode. In this mode, it is necessary to apply the adhesive to the colored shaping elements/linear rigid body shaping elements from three directions.

How to fix: Fixed according to the following processes.
<Primary Stage>
1. First, an axial direction for the shaping is determined. This is similar to the process described in the section (k).
2. It is necessary that the data is modified as those suitable for the linear rigid body shaping elements, which is similar to the process described in the section (k).
3. The shaping elements composing the lowermost layer are placed in order from the left of the row at the depth on the floor of the working space by means of a robot-like operation. In this event, the transparent shaping elements are placed on merely in order. On the other hand, colored shaping elements are placed on as the linear rigid body shaping element(s) having the same color. In other words, the linear rigid body shaping element consists of a certain number of the colored shaping elements. The linear rigid body shaping element may be cut previously to have a desired length. Alternatively, it may be cut by the laser on site. The adhesive is applied on the back and right surfaces of the colored shaping elements/linear rigid body shaping elements before they are arranged. A floor surface supporting the working space is a base made of the paraffin wax which can be replaced with. The black-and-white linear rigid body shaping elements receive a pressure obliquely applied thereto from the above and right ahead after they are arranged to ensure higher bonding with the adhesive.
4. Subsequently, the second layer is formed in a similar manner after the first layer is completed. It is noted that the shaping elements composing the second layer are placed on from the depth of the leftmost column. This results in directional shifting between the first and second layers by 90 degrees. Similar processes are repeated for the third, fourth, . . . and subsequent layers.
5. A predetermined assembly is shaped completely.
<Secondary Stage>
6. The shaped article is taken out of the working space after the completion of the bonding of the colored shaping elements/linear rigid body shaping elements. In this event, the transparent shaping elements for filling made of the paraffin wax may be separated spontaneously from the colored object when they are located outside the object made of the colored shaping elements/linear rigid body shaping elements and are not coated with the adhesive.
7. However, some transparent shaping elements may be bonded to the colored object with the adhesive. In addition, such transparent shaping elements are not separated spontaneously from the colored object that are in a narrow gap or that are filled in a cavity of an object having a shape similar to a pot with a small mouthpiece. The shaped article is thus heated by means of, for example, placing it in hot water to melt the transparent shaping elements made of the paraffin wax. The remaining transparent shaping elements can thus be flown out of the gap or the cavity and completely removed.

Advantage: A colored shaped article can be obtained unlike the process described in the section (k).

(n) Inner colored linear rigid body shaping element mode (adhesive solution three-direction-coating mode)

Transparent shaping element (for filling): Paraffin wax.

Surface colored shaping element: silicone or the like.

Inner linear rigid body shaping element: metal, silicone or the like.

Adhesive: An epoxy resin adhesive (two-pack type) or the like.

How to shape: The shaped article obtained in the section (k) is colored by means of a process different from that described in the section (m). The inside of the shaped article is made of black-and-white shaping elements and only the surfaces are colored. In this process, the adhesive solution is applied to the colored shaping elements/linear rigid body shaping elements from three directions.

How to fix: Fixed according to the following processes.

<Primary Stage>

1. First, an axial direction for the shaping is determined. This is similar to the process described in the section (k).
2. It is necessary that the data is modified as those suitable for the linear rigid body shaping elements. Only the surfaces are colored and the inside is black-and-white.
3. The shaping elements composing the lowermost layer are placed in order from the left of the row at the depth on the floor of the working space by means of a robot-like operation. In this event, the transparent and surface colored shaping elements are placed on merely in order. On the other hand, the inner linear rigid body shaping elements are placed on as those consisting of a certain number of the black-and-white shaping elements. The linear rigid body shaping element may be cut previously to have a desired length. Alternatively, it may be cut by the laser on site. The adhesive is applied on the back and right surfaces of the surface colored shaping elements and the inner linear rigid body shaping elements before they are arranged. A floor surface supporting the working space is a base made of the paraffin wax which can be replaced with. When it is clear that the right on a certain shaping element is made of the paraffin wax, the application of the adhesive to the right surface of that element may be omitted. The surface colored shaping elements and the inner linear rigid body shaping elements receive a pressure obliquely applied thereto from the above and right ahead after they are arranged to ensure higher bonding with the adhesive.
4. Subsequently, the second layer is formed in a similar manner after the first layer is completed. It is noted that the shaping elements composing the second layer are placed on from the depth of the leftmost column. This results in directional shifting between the first and second layers by 90 degrees. Similar processes are repeated for the third, fourth, . . . and subsequent layers.
5. A predetermined assembly is shaped completely.

<Secondary Stage>

6. The shaped article is taken out of the working space after the completion of the bonding of the surface colored shaping elements/inner linear rigid body shaping elements. In this event, the transparent shaping elements for filling made of the paraffin wax may be separated spontaneously from the colored object when they are located outside the object made of the surface colored shaping elements/inner linear rigid body shaping elements and are not coated with the adhesive.
7. However, some transparent shaping elements may be bonded to the colored object with the adhesive. In addition, such transparent shaping elements are not separated spontaneously from the colored object that are in a narrow gap or that are filled in a cavity of an object having a shape similar to a pot with a small mouthpiece. The shaped article is thus heated by means of, for example, placing it in hot water to melt the transparent shaping elements made of the paraffin wax. The remaining transparent shaping elements can thus be flown out of the gap or the cavity and completely removed.

Advantage: A colored shaped article can be obtained unlike the process described in the section (k).

(o) Working area distribution mode

To shorten the time by means of distributing the working area in the specific examples described in (g), (h), (k), (l), (m), and (n).

How to fix: Individual slices are prepared simultaneously in different working areas rather than stacking the shaping elements from the bottom layer. These slices are gathered in a common working area and stacked up therein.

Advantage: It is possible to save the time significantly. No robot-like behavior is required with a three-dimensional outlet for the shaping elements.

(p) Development mode (No. 1)

A three-dimensional image (n by n by n) is developed or exploded into a two-dimensional image (n by n2). The shaping elements are arranged into a two-dimensional assembly of the shaping elements. The two-dimensional assembly is then folded into a three-dimensional shaped article. In this event, the two-dimensional assembly may be "rolled up" just as manufacturing a roll cake.

(q) Development mode (No. 2)

A three-dimensional image (n by n by n) is developed or exploded into a one-dimensional image of 1 by n3. One-dimensional assembly of the shaping elements are then arranged and the folded into a three-dimensional shaped article. In this event, the one-dimensional assembly may be folded from the center thereof.

[Modifications]

The present invention is not limited to the above mentioned embodiment, and various changes, modifications, and alternations may be made. For example, the attribute information on each three-dimensional cell can be specified by a user by using a pointing device in the embodiment. However, the data indicative of the attribute of the three-dimensional cell may be produced indirectly even when a graphical image is obtained by means of designating a certain graphical element and using a predetermined algorithm. More specifically, the result of the calculation carried out according to the algorithm may be used for the indirect production of the data. A temperature, a flow velocity, and/or an acoustic wave may be used as the attribute of the three-dimensional cell. In such a case, a corresponding shaped article can be obtained by using the present invention. The attribute information of the three-dimensional cell is not limited specifically. The attribute of the three-dimensional cell may be, for example, those of a visible light, an infrared ray, and an X-ray. For example, electromagnetic wave and/or acoustic data obtained in a magnetic resonance instrument (MRI) and a computer tomography (CT) scanner may be used as the attribute of the three-dimensional cell.

Features and properties of the shaped article may also be changed as well as the attribute of the three-dimensional cells. The features and properties of the shaped article may be potential ones. More specifically, the shaped article may have a characteristic expressed or appeared as a result of a particular processing or under a particular condition. For example, the properties or phases may be changed by means of heating, cooling, magnetization, demagnetization, chemical treatments, and irradiation of a certain light beam to produce a final shaped article. Alternatively, a feature of the shaped article may be expressed by such a processing.

For example, the paraffin wax is used above for the transparent shaping elements. However, the shaping elements corresponding to the transparent attribute may be made of a material that is changed from a solid phase to a liquid phase, or to a gaseous phase by means of heating or chemical treatment. In such a case, the material of the type described is flown out when heated or subjected to chemical treatment, leaving a final shaped article. Alternatively, the shaping elements corresponding to the transparent attribute may be made of a granular mass that is temporarily solidified or packed rather than of a material of which phase is changed. The mass is broken when heated or subjected to chemical treatment, leaving a final shaped article.

It is also possible to produce a shaped article of which particular feature is expressed in a certain environment by using the shaping elements having an attribute appeared in response to, for example, change in environment or difference in irradiation light. For example, it is possible to provide a shaped article that gives various visible impressions in environments with different wavelengths.

The adhesive is not the only means to fix the shaping elements. For example, a concavity and a convexity may be provided in and on the shaping elements. The concavity and the convexity may be mated with each other to fix the shaping elements. Alternatively, a number of small projections may be provided on at least a portion of a surface of the shaping element. The projections of the two shaping elements may be engaged with each other due to a frictional force or so to fix them. Furthermore, the adhesive if used may be a hot-melt adhesive rather than the epoxy resin adhesive.

At least a portion of each shaping element may be formed of a soft magnetic body, and such shaping elements may be stacked up on a hard magnetic body (magnet) substrate. In such a case, the shaping elements can be stacked up in a stable manner because of the magnetic force. Of course, the adhesive including the hot-melt adhesive may be combined. Alternatively, outer surfaces of the shaping elements may be formed of a plastic material and the shaping elements may be welded by heat. An electromagnet may be used in place of the magnet to fix the shaping elements. With this structure, the shaping elements may be separated from each other and used again by means of eliminating a remnant magnetization.

The shaped article may be various objects. For example, medical and pharmaceutical products may be produced according to the present invention. Conventionally, a mixed pharmaceutical product of drugs A and B may be prepared by means of mixing fine powder of the drugs A and B by using an agitator. This technique is not suitable for cases where a desired pharmaceutical product tends to be broken by the agitator, where it is desired to increase a particle size, or where positive and accurate formulation is required. In addition, it is difficult for this technique to prepare a tablet of which surface has different component from that of an encapsulated core. According to the present invention, the shaping elements may be produced with different drugs to control positively the formulation of a resultant pharmaceutical product.

The present invention can also be applied to manufacture electrical parts. For example, it is possible to align various materials having different conductance positively in a three-dimensional manner to realize a predetermined characteristic curve. A novel condenser may be manufactured by means of controlling the structure thereof in a three-dimensional manner.

Furthermore, atomic laser technique can be utilized for manipulation of shaping elements.

Furthermore, the present invention may be applied to food products. Conventionally, various food materials are combined such as peanut or chocolate having different taste and feeling to produce different products. However, such products are manufactured through a rough control of the agitation, mixing, and alignment. According to the present invention, a new taste may be provided by means of aligning the shaping elements with a high accuracy. For example, such a cubic candy may be produced that has six surfaces with six different tastes, respectively. Alternatively, a cubic candy containing a regular tetrahedral candy having a peppermint taste may be produced.

As described above, according to the present invention, it is possible to produce a three-dimensional shaped article or a prototype thereof based on the attribute data of the voxels. In addition, it is possible to provide blending apparatus and method for use in blending a material of medical and pharmaceutical products, foods, and electrical parts to produce an end product or an intermediate product of the medical and pharmaceutical products, the foods, and the electrical parts.

What is claimed is:

1. A solid object generation apparatus comprising:
   means for memorizing one or more attributes for each of a plurality of voxels filling a predetermined three-dimensional space;
   means for feeding solid shaping elements, each of the solid shaping elements corresponding to at least one voxel of the plurality of voxels, at least one of the attributes of the at least one voxels corresponding to at least one type of the solid shaping elements;
   means for arranging solid shaping elements thus fed, in a predetermined shaping space in accordance with locations and attributes of the voxels; and
   means for fixing at least a part of the solid shaping elements after being arranged.

2. A solid object generation apparatus as claimed in claim 1, wherein the fixing means bonds neighboring solid shaping elements when the neighboring solid shaping elements correspond to voxels having one predetermined attribute or either of a plurality of predetermined attributes.

3. A solid object generation apparatus as claimed in claim 1, wherein each of the voxels has an optical attribute.

4. A solid object generation apparatus as claimed in claim 3, wherein the shaping elements have an optical property corresponding to an attribute of corresponding voxels.

5. A solid object generation apparatus as claimed in claim 3, wherein the shaping elements are made of a material corresponding to an attribute of corresponding voxels.

6. A solid object generation apparatus as claimed in claim 3, wherein no solid shaping element is arranged at locations corresponding to at least a part of voxels having an attribute of transparency.

7. A solid object generation apparatus as claimed in claim 1, further comprising means for producing one or more attribute for each of a number of voxels filling the predetermined three-dimensional space.

8. A solid object generation method comprising the steps of:
   memorizing one or more attributes for each of a plurality of voxels filling a predetermined three-dimensional space;
   feeding solid shaping elements, each of the solid shaping elements corresponding to at least one voxel of the plurality of voxels, at least one of the attributes of the at least one voxel corresponding to at least one type of the solid shaping elements;
   arranging solid shaping elements thus fed, in a predetermined shaping space in accordance with locations and attributes of the voxels; and
   fixing at least a part of the solid shaping elements after being arranged.

9. An arranging apparatus comprising:
   means for memorizing one or more attributes for a plurality voxels filling a predetermined three-dimensional space;

means for feeding solid arranging elements, each of the solid arranging elements corresponding to at least one voxel, at least one of the attributes of the at least one voxel corresponding to at least one type of the solid arranging elements;

means for arranging solid arranging elements thus fed, in a predetermined real space in accordance with locations and attributes of the voxels; and means for fixing at least a part of the solid arranging elements after being arranged.

10. A solid object generation apparatus comprising:

memory for memorizing one or more attributes for each of a plurality of voxels filling a predetermined three-dimensional space;

a stacker for storing and feeding a plurality of solid shaping elements, each solid shaping element corresponding to at least one voxel of the plurality of voxels, at least one of the attributes of the at least one voxel corresponding to at least one of the solid shaping elements;

a picker for arranging solid shaping elements fed by the stacker in a predetermined shaping space in accordance with locations and attributes of the plurality of voxels; and means for fixing at least a part of the solid shaping elements after being arranged.

11. A solid object generation method comprising the steps of:

memorizing one or more attributes for each of a plurality of voxels filling a predetermined three-dimensional space;

feeding solid shaping elements, each of the solid shaping elements corresponding to at least one voxel of the plurality of voxels, at least one of the attributes of the at least one voxel corresponding to at least one type of the solid shaping elements;

arranging solid shaping elements thus fed, in a predetermined shaping space in accordance with locations and attributes of the plurality of voxels;

fixing the solid shaping element after being arranged; and removing at least one solid shaping element corresponding to a predetermined attribute from the fixed solid shaping elements.

* * * * *